United States Patent [19]

Dubreuil et al.

[11] Patent Number: 5,232,286
[45] Date of Patent: Aug. 3, 1993

[54] LONG LASTING THERMOCOUPLE FOR HIGH TEMPERATURE MEASUREMENTS OF LIQUID METALS, MATTES AND SLAGS

[75] Inventors: Alain Dubreuil, Hull; Jim Skeaff, Ottawa, both of Canada

[73] Assignee: Her Majesty the Queen in Right of Canada as represented by the Minister of Energy, Mines and Resources, Canada

[21] Appl. No.: 682,947

[22] Filed: Apr. 10, 1991

[51] Int. Cl.⁵ .................... G01K 1/08; H01L 35/12
[52] U.S. Cl. .................... 374/139; 374/179; 136/236.1
[58] Field of Search .............. 374/139, 140, 163, 179, 374/180; 136/234, 236, 239, 240, 241; 75/235, 238, 245, 246, 247, 248

[56] References Cited

U.S. PATENT DOCUMENTS

| | | | |
|---|---|---|---|
| 885,430 | 4/1908 | Bristol | 374/139 |
| 3,473,968 | 10/1969 | Rinesch et al. | 136/230 |
| 3,580,078 | 5/1971 | Mackenzie | 136/234 X |
| 3,619,381 | 11/1971 | Fitterer | |
| 3,757,206 | 9/1973 | Dorst | 374/180 |
| 4,102,708 | 7/1978 | Dancy | 136/234 X |
| 4,377,347 | 3/1983 | Hanmyo et al. | 374/139 |
| 4,686,320 | 8/1987 | Novak et al. | 136/236.1 |
| 4,689,077 | 8/1987 | Clevigne et al. | 75/235 |
| 4,721,533 | 1/1988 | Phillippi et al. | 374/179 X |
| 4,721,534 | 1/1988 | Phillippi et al. | 374/179 X |
| 4,732,620 | 3/1988 | Hunold | 136/236.1 |
| 4,749,416 | 6/1988 | Greenspan et al. | 136/232 |
| 4,934,831 | 6/1990 | Volbrecht | 374/179 X |
| 4,964,736 | 10/1990 | Cure et al. | 136/234 X |

FOREIGN PATENT DOCUMENTS

| | | | |
|---|---|---|---|
| 161836 | 9/1983 | Japan | 374/180 |
| 246636 | 11/1986 | Japan | 374/139 |
| 714173 | 2/1980 | U.S.S.R. | 374/139 |

*Primary Examiner*—William A. Cuchlinski, Jr.
*Assistant Examiner*—G. Bradley Bennett
*Attorney, Agent, or Firm*—Nixon & Vanderhye

[57] ABSTRACT

A thermocouple is disclosed for the continuous measurement of the temperature of a molten phase, which thermocouple comprises two cermet elements of dissimilar metals in which the thermoelectric circuit is closed by the medium, the temperature of which is being measured. The use of dissimilar cermet elements as opposed to conventional metallic wires imparts to the thermocouple sensor a superior resistance to high temperature, corrosive environments which allows it to be used for extended periods of time and for varied applications. A method of using the thermocouple is also disclosed.

14 Claims, 5 Drawing Sheets

LONG LASTING THERMOCOUPLE FOR HIGH TEMPERATURE MEASUREMENTS OF LIQUID METALS, MATTES AND SLAGS

FIELD OF THE INVENTION

This invention relates to an improved thermocouple. More particularly, the invention relates to a thermocouple designed to measure the temperature of molten phases (metals, mattes, speiss' or slags) in metallurgical operations within an accuracy of +/−2° C. without the need for maintenance or calibration over significant periods of time.

Hitherto, the high temperature of metallurgical melts has usually been measured by conventional wire thermocouples or optical pyrometers. However, there is presently a widespread need within the metallurgical industry for an instrument capable of accurately measuring the temperature of molten phases over extended periods of time without the need for maintenance or recalibration. Pyrometers are inadequate in this respect as they are only accurate in the order of +/−20° C. and are subject to periodic recalibration. Moreover, conventional thermocouples fabricated of dissimilar metal wires, although of sufficient precision, have a limited practicable lifespan in corrosive, high temperature environments; the lifespan being a function of the dissolution rate of the thermocouple sleeve or protection tube.

DESCRIPTION OF THE RELATED ART

Cermets are a composite of a ceramic and a metal and have hitherto been used to a limited extent in pyrometers and thermocouples. For example, U.S. Pat. No. 3,473,968 (Rinesch et al.) teaches a thermocouple device for measuring the temperature of hot media in reaction vessels comprising a tube of heat-proof material which penetrates the wall of the vessel and is sealed at its inner end by a replaceable cermet plug within which is mounted the conventional metal wire thermocouple.

U.S. Pat. No. 4,686,320 (Novak et al.) describes a composite article comprising a porous cermet electrode on a solid electrolyte suitable for use in thermoelectric generators and Canadian Patent No. 859,993 (Strohmeier et al.) discloses a thermoelectric device for measuring the temperature of corrosive media such as metal melts which comprises a cermet element body in which the hot junctions of the thermocouples together with their insulating means are enclosed by either pressing or sintering means. Finally, a translation of the German article "Application of Cermets in the Iron and Steel Industry", 1967 by Strohmeier et al. describes the use of $Cr-$, $Mo-$ and $Al_2O_3-$ based materials for measuring purposes in the copper industry. However, no mention is made of the use of two dissimilar cermets as a thermocouple.

SUMMARY OF THE INVENTION

It is an object of the present invention to provide a long-lasting thermocouple for high temperature measurements of molten phases in metallurgical operations and in particular of liquid metals, mattes and slags.

It is a further object of the invention to provide a thermocouple which is resistant to corrosive, high temperature environments and allows accurate measurements for extended applications and periods of time without the need for maintenance or recalibration.

Accordingly, the invention provides a thermocouple for the continuous measurement of the temperature of a metal-containing medium, the thermocouple comprising two cermet elements of dissimilar metals adapted for use in conjunction with a molten phase, such as a matte, metal, speiss or slag, in which the thermoelectric circuit is closed by the molten phase, the temperature of which is being measured.

The invention also provides a method of using the thermocouple device which comprises incorporating the thermocouple into a wall of a metallurgical reaction vessel, the molten phase, the temperature of which is being measured in said vessel, closing the thermoelectric circuit of the thermocouple.

Due to the characteristic properties of cermets, a thermocouple comprising two cermets of which the metal components are dissimilar will not only provide an accurate measurement of temperature but will also afford increased resistance to a corrosive environment in which measurements are being carried out. The increased resistance to corrosion, of course, allows for increased durability of the thermocouple. Furthermore, depending on the geometry of the application, such a thermocouple can be incorporated in the brick lining of a furnace or vessel wall, and continuously expose new surface to the medium being measured while progressively wearing out or eroding, along with the brick furnace lining, but while continuing to be operative. Thus, the life of the cermet thermocouple of the invention can be expected to be approximately the same as the life of the vessel itself.

Conventional thermocouples comprise metallic wires which are susceptible to corrosion and thus require protection from the environment. Such protection is usually in the form of a protective sleeve and the rate of deterioration thereof determines the lifespan of the measuring system.

Cermets possess some properties of ceramics, e.g. good resistance to oxidation, and some properties of metals, in particular electrical conductivity. A thermocouple based on two cermets of dissimilar metals does not comprise metallic wires in a thermoelectric circuit; instead, the cermets carry the current and the circuit is closed by the molten matte, metal, speiss or slag phase, the temperature of which is being measured. The physical and chemical properties of the cermet rods provide resistance to the eroding effects of a corrosive environment which substantially reduces the rate of the thermocouple system deterioration. Specifically, the ceramic content of a cermet acts to provide oxidation resistance while the metallic content provides electrical conductivity. Moreover, since the thermoelectric circuit is closed by the medium being measured, even significant erosion of the cermet rods would not destroy the measuring system as the circuit will not be broken.

Accordingly, with the correct design and implementation, the life of the thermocouple sensor could be equal to the life of the refractory lining of the reaction vessel in a metallurgical installation. The cermet thermocouple of the present invention is particularly applicable to metallurgical installations such as, inter alia, furnaces, refractory brick linings, ladles and forehearths.

The dissimilar cermet thermocouple of the invention can be based on a range of differing pairs of cermets, for instance those formed from a ceramic selected from $Al_2O_3$, $ZrO_2$ and SiC and a metal selected from Mo, Cr, Ir and Ni. One preferred embodiment comprises Mo-$Al_2O_3$ and Cr-$Al_2O_3$. Another preferred cermet thermocouple is based on Mo-$ZrO_2$ and Cr-$Al_2O_3$. Operable cermets could also potentially be synthesized from ceramics including $TiO_2$, MgO, $Y_2O_3$, $La_2O_3$, $Sc_2O_3$ and $B_4C$ and metals including Zr, Ti, V, Nb, Ta, W, Re, Ru, Rh, Co, Pt, Au, Os, Ag, Pd, U, La, Y and Mn. In each case, resulting cermet could be paired with any other if the thermoelectric effect were great enough to provide a practical thermocouple.

BRIEF DESCRIPTION OF THE DRAWINGS

Further objects, features and advantages of the invention will become apparent to those skilled in the art from the following description thereof when taken in conjunction with the accompanying drawings, in which.

DESCRIPTION OF THE PREFERRED EMBODIMENTS

Figure 2:
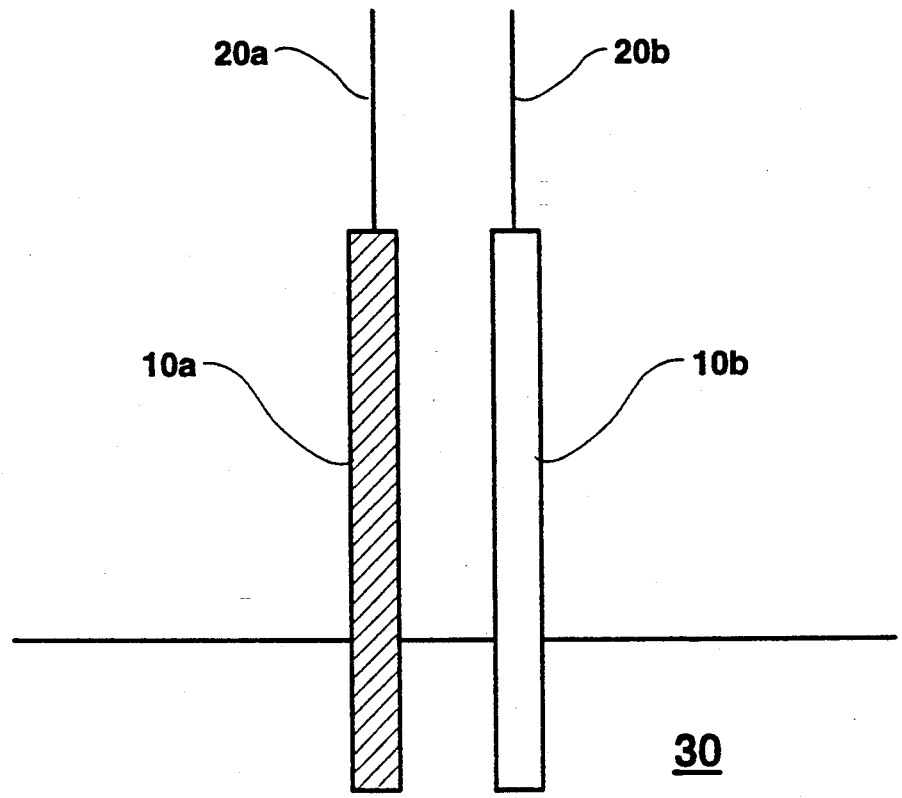
FIG. 2 is a schematic illustration of a preferred form of cermet thermocouple sensor.

Referring now to the drawings, a preferred form of cermet-based thermocouple of the present invention is shown in FIG. 2. The thermocouple is defined by two dissimilar cermets 10a and 10b each adjacent to the other and in parallel relationship. At one end of each cermet is disposed respective leads 20a and 20b while the other end is exposed to a molten matte, metal, speiss or slag phase 30, which melt acts to close the thermoelectric circuit. Generally speaking, the invention is more relevant to slags of high ionic conductivity as slags of lower conductivity may possess too high a resistance to complete a circuit.

Figure 1:
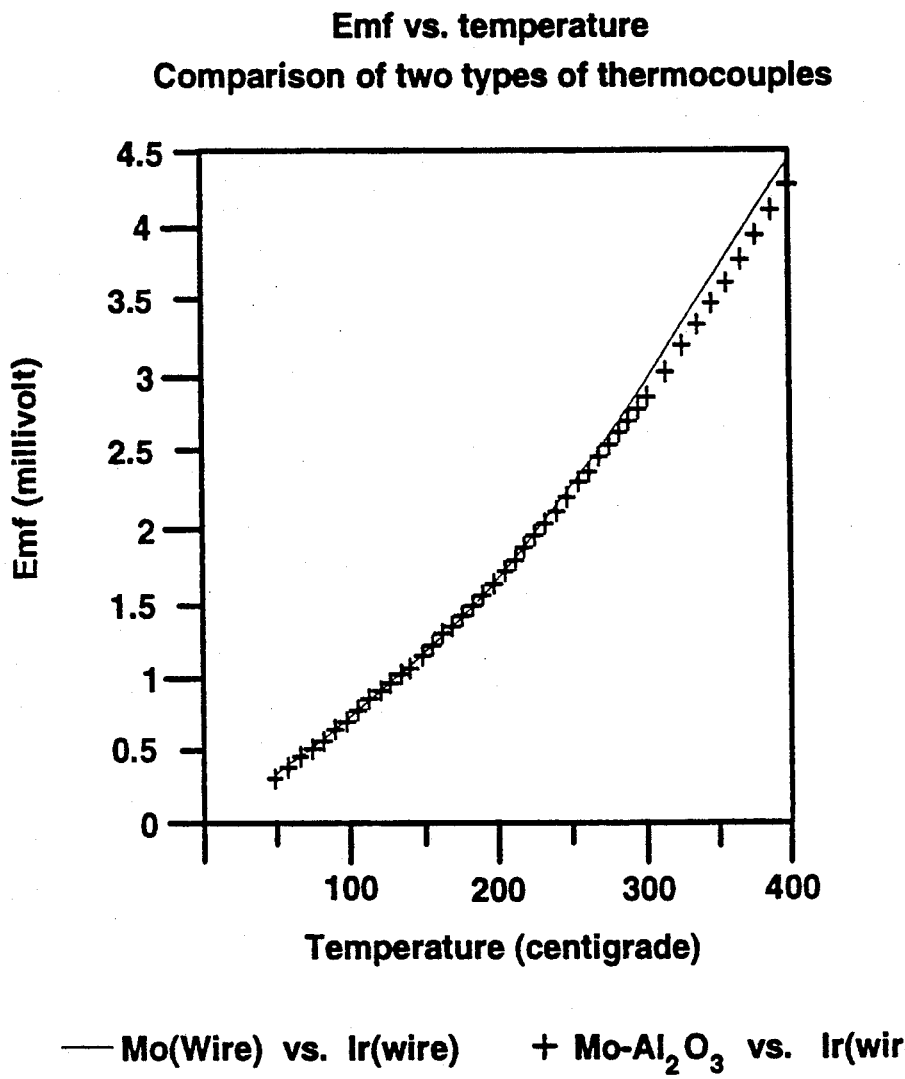
FIG. 1 is a graph plotting electromotive force (millivolt) against temperature (°C.) for both a pure Mo wire vs. a pure Ir wire and an Mo-$Al_2O_3$ cermet vs. a pure Ir wire.

In general, when two wires composed of dissimilar metals are joined at both ends and one of the wires is heated, a continuous current flow will occur in the thermoelectric circuit which has been created. This phenomenon, which is the basis of thermocouples, is known as the Seebeck Effect. In the thermocouple of the present invention, two cermets of dissimilar metals function in place of the standard metallic wires. As can be seen in FIG. 1, the Seebeck Effect occurs to the same extent and in the same manner in both the conventional Mo vs. Ir wire thermocouple and in a thermocouple comprising a cermet (Mo-$Al_2O_3$) and a metallic wire, Ir. The fact that the Seebeck Effect in the all-wire thermoelectric circuit is similar for a metal wire and a cermet containing the said metal indicates the suitability of using cermets in the place of metallic wires in a thermocouple.

Figure 3:
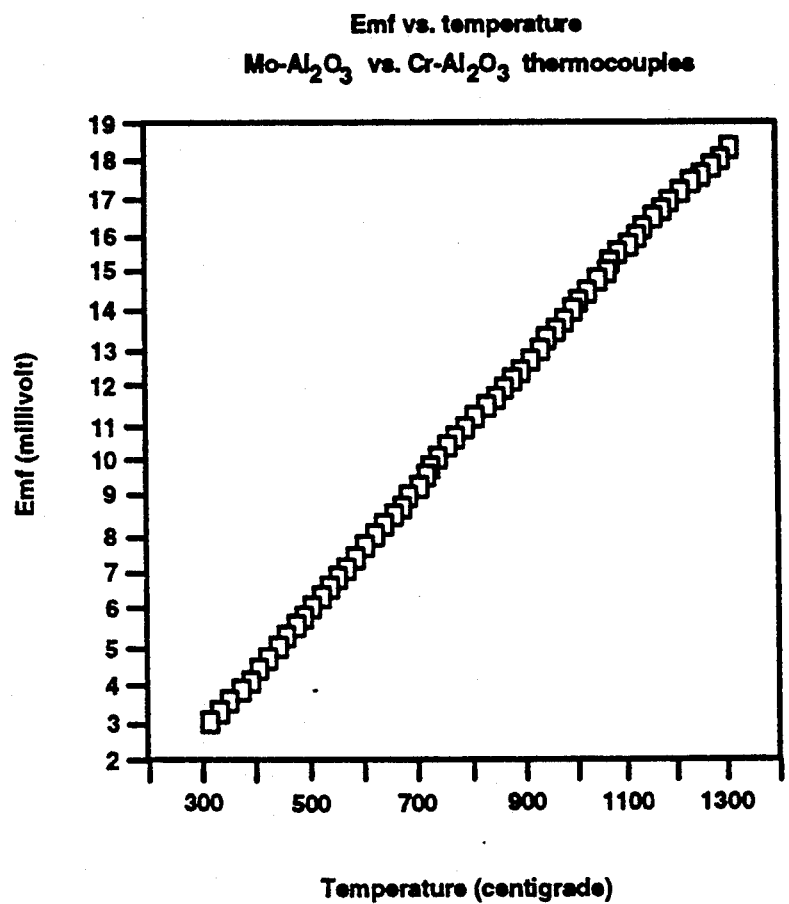
FIG. 3 is a plot of electromotive force (millivolt) against temperature (°C.) for a thermocouple of two dissimilar cermets (Mo-$Al_2O_3$ vs. Cr-$Al_2O_3$)

With reference to FIG. 3, it can be seen that the voltage generated in a thermocouple based on dissimilar cermets (Mo-$Al_2O_3$ vs. Cr-$Al_2O_3$) is proportional to the temperature of the hot junction. The cermets employed in this instance were Metamic 829 ($Al_2O_3$ 19.4%, Mo 77.7%, $ZrO_2$ 2.8%) and Metamic 612 ($Al_2O_3$ 24%, $SiO_2$ 4%, Cr 72%). This clearly indicates that the inherent relationship between voltage and temperature necessary to the functioning of a thermocouple does in fact exist in a thermocouple comprising two dissimilar cermets. The voltage generated is in the same order of magnitude as the conventional platinum type thermocouple.

The preferable method of using the thermocouple comprises incorporating the thermocouple sensor into the interior refractory wall of a metallurgical reaction vessel such as, inter alia, a furnace, ladle or forehearth. The metal-containing melt within the installation closes the thermoelectric circuit allowing an accurate measurement of the melt temperature to be effected in the order of $+/-2°$ C. The characteristic physical and chemical properties of cermets provide superior resistance to the corrosive effects of molten phases such as metals, mattes and slags, substantially extending the operable life of the thermocouple. Since the molten phase closes the thermoelectric circuit, any deterioration of the cermets has no significant effect upon the accuracy of the temperature measurements.

Figure 4:
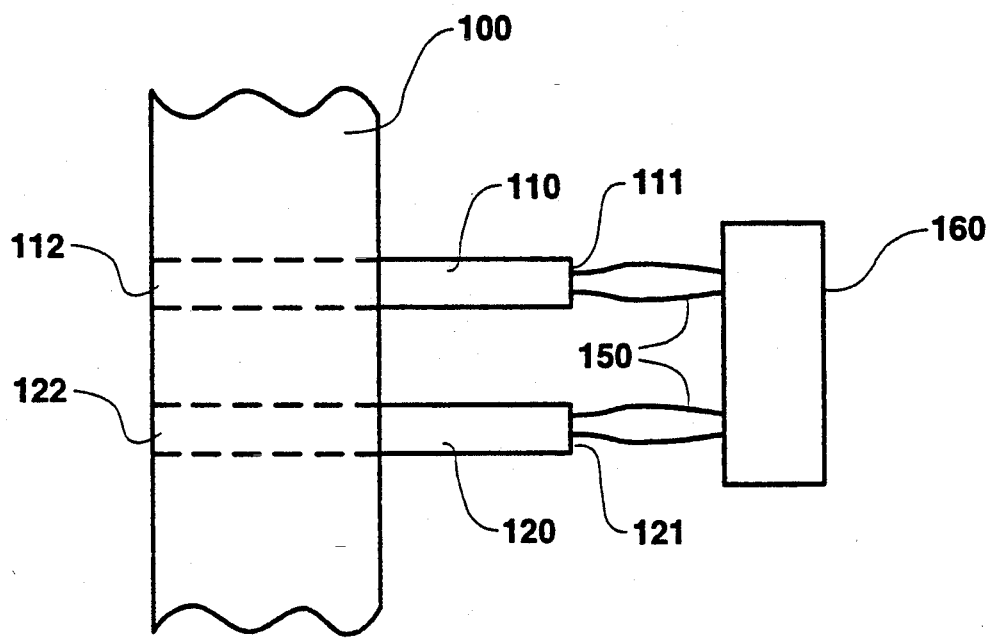
FIG. 4 is a schematic diagram illustrating an embodiment of invention in which the thermocouple device is incorporated in the wall of a reaction vessel.

For example, FIG. 4 depicts the physical embodiment of a thermocouple comprising two dissimilar cermet elements 110 and 120 incorporated into the interior refractory wall, for instance refractory brick 100, of a reaction vessel. The cool ends of the cermet rods 111 and 121, which extend outside of and beyond one edge of the refractory brick, are available for connection to a suitably calibrated temperature readout device 160. The "hot" ends of the cermet rods 112 and 122, which are level with the other edge of the brick, would be exposed to the molten phase.

The means of connecting the cermet thermocouple described above to a readout meter are readily seen in FIG. 4. In order for the cermet thermocouple to yield accurate temperature readings, the temperature of the cool ends of the cermets must be known. This may be accomplished by connecting a conventional thermocouple to the cold end of each cermet. Hence, a knowledge of the temperature of the cool end of each cermet enables the determination of the temperature of the molten phase. As can be seen in FIG. 4, the conventional metallic thermocouple leads 150 from the cermet elements 110 and 120 connect the cermet elements to a thermocouple readout meter 160. The leads 150 are not exposed to the corrosive molten phase but, as noted above, act to measure the temperature of the cool end of each cermet element thereby providing a basis of comparison from which to determine the molten phase temperature; this also being necessary to conventional thermocouple operation.

Figure 5:
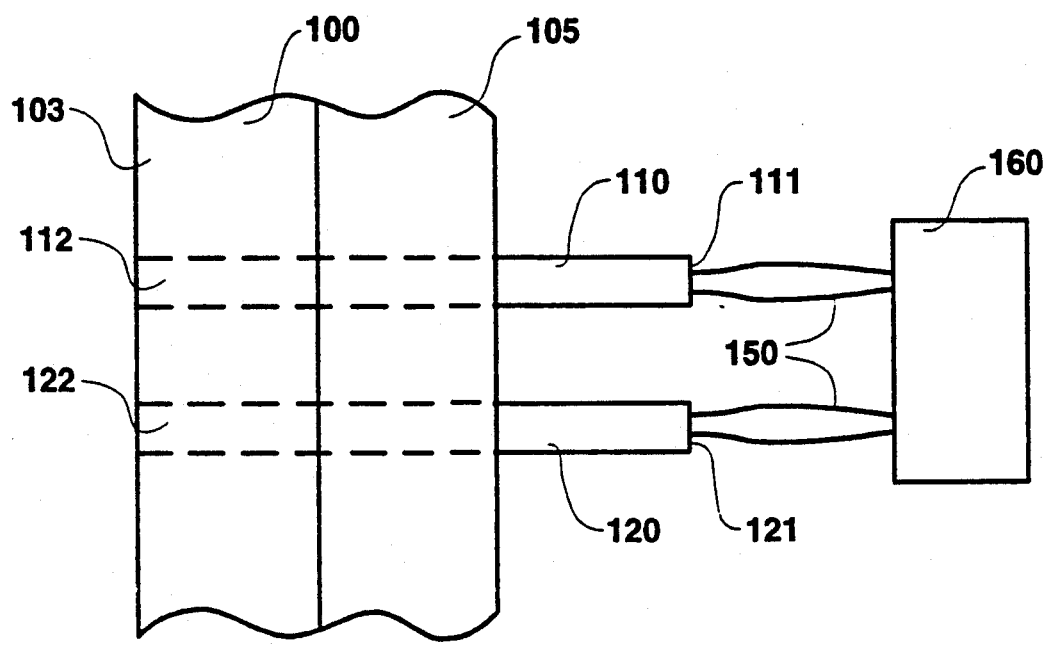
FIG. 5 illustrates a variation of the embodiment depicted in FIG. 4.

With reference to FIG. 5, a variation of the reaction vessel of FIG. 4 is depicted. In this embodiment, the wall of the reaction vessel 100 is composed of two layers, the outer layer 105 is composed of insulating brick and the inner layer 103 is composed of fire brick.

We claim:

1. A thermocouple for the continuous measurement of the temperature of a molten phase, comprising:
    first and second cermet elements for measuring the temperature of a molten phase, said first element being formed of a first cermet different from a second cermet of which the second element is formed, wherein a thermoelectric circuit of the thermocouple is closed by the molten phase.

2. A thermocouple as claimed in claim 1, wherein the thermocouple is adapted for incorporation into the refractory lining of a metallurgical reaction vessel so as to communicate with the molten phase contained within the interior of said reaction vessel.

3. A thermocouple as claimed in claim 2, wherein the metallurgical reaction vessel is a furnace, forehearth, ladle or converter or other means of containing a molten phase.

4. A thermocouple as claimed in claim 1, wherein the molten phase is a metal.

5. A thermocouple as claimed in claim 1, wherein the molten phase is a matte.

6. A thermocouple as claimed in claim 1, wherein the molten phase is a slag.

7. A thermocouple as claimed in claim 1, wherein the molten phase is a speiss.

8. A thermocouple as claimed in claim 1, wherein one element is a Mo-$Al_2O_3$ cermet and the other element is a Cr-$Al_2O_3$ cermet.

9. A thermocouple as claimed in claim 1, wherein one element is a Mo-$ZrO_2$ cermet and the other element is a Cr-$Al_2O_3$ cermet.

10. A thermocouple as claimed in claim 1, wherein the dissimilar cermet elements are each composed of a different metal selected from the group consisting of Zr, Mo, Cr, Ti, V, Nb, Ta, W, Re, Ru, Rh, Co, Pt, Au, Os, Ag, Pd, U, La, Y, and Mn, and a ceramic selected from the group consisting of $Al_2O_3$, $ZrO_2$, $TiO_2$, MgO, $Y_2O_3$, $La_2O_3$, $Sc_2O_3$, SiC and $B_4C$.

11. A method for continuous measurement of the temperature of a molten phase comprising:
   incorporating into an interior refractory wall of a furnace or other vessel a thermocouple having first and second cermet elements, said first element being formed of a first cermet which is different from a second cermet of which the second element is formed, and
   directly measuring the temperature of the molten phase contained in the furnace or other vessel with the cermet elements.

12. The method according to claim 11, wherein one end of each of the two cermet elements physically contacts the molten phase.

13. The method according to claim 12, further comprising:
   connecting the other ends of each cermet element to a metallic thermocouple, wherein the metallic thermocouple is connected to a temperature readout meter.

14. The method according to claim 11, wherein the molten phase completes a thermoelectric circuit of the thermocouple.

* * * * *